(12) United States Patent
McCahon et al.

(10) Patent No.: US 12,413,039 B2
(45) Date of Patent: Sep. 9, 2025

(54) MULTIPLE COHERENT WAVELENGTH OPTICAL SOURCES

(71) Applicant: APPLIED ENERGETICS, INC., Tucson, AZ (US)

(72) Inventors: Stephen William McCahon, Tucson, AZ (US); Alan Kost, Tucson, AZ (US)

(73) Assignee: Applied Energetics, Inc., Tucson, AZ (US)

( * ) Notice: Subject to any disclaimer, the term of this patent is extended or adjusted under 35 U.S.C. 154(b) by 901 days.

(21) Appl. No.: 17/648,737

(22) Filed: Jan. 24, 2022

(65) Prior Publication Data
US 2022/0239055 A1    Jul. 28, 2022

Related U.S. Application Data

(60) Provisional application No. 63/150,834, filed on Feb. 18, 2021, provisional application No. 63/141,296, filed on Jan. 25, 2021.

(51) Int. Cl.
| | |
|---|---|
| *H01S 3/067* | (2006.01) |
| *G02F 1/35* | (2006.01) |
| *H01S 3/00* | (2006.01) |
| *H01S 3/094* | (2006.01) |
| *H01S 3/0941* | (2006.01) |
| *H01S 3/10* | (2006.01) |
| *H01S 3/23* | (2006.01) |
| *H01S 3/30* | (2006.01) |

(52) U.S. Cl.
CPC ............ *H01S 3/302* (2013.01); *G02F 1/3528* (2021.01); *H01S 3/0057* (2013.01); *H01S 3/06754* (2013.01); *H01S 3/06758* (2013.01); *H01S 3/094046* (2013.01); *H01S 3/094096* (2013.01); *H01S 3/09415* (2013.01); *H01S 3/10092* (2013.01); *H01S 3/2316* (2013.01)

(58) Field of Classification Search
CPC .... H01S 3/302; H01S 3/0057; H01S 3/06754; H01S 3/06758; H01S 3/094046; H01S 3/094096; H01S 3/09415; H01S 3/10092; H01S 3/2316; G02F 1/3528
See application file for complete search history.

(56) References Cited

U.S. PATENT DOCUMENTS

| | | | |
|---|---|---|---|
| 7,764,720 B1 * | 7/2010 | Bronder | H01S 3/06754 372/6 |
| 2011/0249321 A1 * | 10/2011 | Savage-Leuchs | H01S 3/094003 359/341.3 |
| 2017/0352999 A1 * | 12/2017 | Cormier | G02F 1/39 |
| 2023/0124281 A1 * | 4/2023 | Runcorn | H01S 3/10092 372/3 |

FOREIGN PATENT DOCUMENTS

WO    WO-2007127356 A2 *    11/2007    ............ H01S 3/302

* cited by examiner

*Primary Examiner* — Yuanda Zhang
(74) *Attorney, Agent, or Firm* — Martensen IP; Michael C. Martemsen

(57) ABSTRACT

Low wavelength infrared Super Continuum (SC) signals from a master oscillator seeds an amplifier that supports the Raman effect. Counter-propagating, high-power, continuous wave, and quasi-continuous wave quantum cascade lasers pumps (amplify) the optical seeds forming multiple coherent wavelength optical pump sources.

17 Claims, 10 Drawing Sheets

MULTIPLE COHERENT WAVELENGTH OPTICAL SOURCES

RELATED APPLICATION

The present application relates to and claims the benefit of priority to U.S. Provisional Patent Application No. 63/141,296, filed 25 Jan. 2021 and U.S. Provisional Patent Application No. 63/150,834, filed 18 Feb. 2021, both of which are hereby incorporated by reference in their entirety for all purposes as if fully set forth herein.

BACKGROUND OF THE INVENTION

Field of the Invention

Embodiments of the present invention relate, in general, to seeded Raman amplification and more particularly to concurrent Raman amplification of one or more sources.

Relevant Background

Ultra-Short Pulse (USP) lasers in the infrared spectrum have generally been achieved using doped laser gain media which produces specific wavelengths. Parametric optical conversion which utilizes wave mixing in nonlinear optical materials to convert photon energies provides a tunable alternative and other methods such as free electron lasers can provide wavelength tunable USPs. Quantum cascade lasers, by themselves, however, cannot currently generate an USP output.

Conventional USP lasers with conventional beam amplifiers (e.g., optical fiber with an optically active dopant) can be used to convert incoherent and low-brightness pump light into a high brightness, coherent signal but beam amplifiers are limited to operation at wavelengths for which there exists a suitable optically active dopant material such as Ytterbium (Yb), Neodymium (Nd), or Holmium (Ho).

Unliked conventional beam amplifiers, Raman amplification is based on the Stimulated Raman Scattering (SRS) phenomenon which is when a higher frequency photon induces inelastic scattering thereby producing a lower-frequency photon in an optical medium in the nonlinear regime. As a result, another signal photon is produced, with the surplus energy resonantly passed to the vibrational or rotational states of the medium. This process, as with other stimulated emission processes, allows all-optical amplification.

Raman amplifiers employ an optical pump beam and a suitable nonlinear optical material to provide amplification at a wider range of wavelengths. The Raman amplification process is "instantaneous" so that pulsed-optical-pump beams can be used to generate high-power pulses from a signal that is initially Continuous Wave (CW). Conversely, a CW pump beam can add power to a pulsed signal beam. SRS does not require a phase matched interaction and therefore can be performed with pump light from any direction and any phase.

A Raman amplifier contains an appropriate Raman gain material that can be a solid, liquid, or gas, and has a specific frequency shifted gain spectrum. In a Raman process optical power is transferred from the Raman Pumps to the Optical Seed via the SRS process. The seed wavelength is at the first Stokes shift of the Raman gain material. The process of power conversion from the pump to the $1^{st}$ Stokes, and from the $1^{st}$ Stokes to the $2^{nd}$ Stokes, etc., continues unless terminated in some manner. But Raman amplification, by itself, too has limitations.

Lacking is a system by which Raman amplifiers can employ an optical pump beam with a suitable Raman optical material to provide amplification at a wider range of wavelengths. What is needed is a system capable of producing a high repetition rate, high peak, and average power USP Long Wave Infrared (LWIR) laser through Raman amplification and a monolithic all-fiber based architecture. These and other deficiencies of the prior art are addressed by one or more embodiments of the present invention.

Additional advantages and novel features of this invention shall be set forth in part in the description that follows, and in part will become apparent to those skilled in the art upon examination of the following specification or may be learned by the practice of the invention. The advantages of the invention may be realized and attained by means of the instrumentalities, combinations, compositions, and methods particularly pointed out in the appended claims.

SUMMARY OF THE INVENTION

A signal from a master oscillator seeds an amplifier that supports the Raman effect. Counter-propagating, high-power, continuous wave, and quasi-continuous wave pumps (amplify) the optical seed forming two or more tunable coherent wavelength optical pump sources.

In one version of the present invention, a selectable coherent wavelength optical source system includes a tunable master oscillator configured to produce two or more optical seeds. An amplifier is configured to receive the two or more optical seeds along with two or more independent optical pump sources (pumps). Each optical seed is combined into a volume within the amplifier with distinct and independent optical pump sources thereby producing two or more amplified distinct coherent wavelength selectable optical pump sources.

Other aspects of a tunable coherent wavelength optical source system include that each of the two or more optical seeds occupies a separate and overlapping volume within the amplifier. It is also noted that each optical seed can be a coherent Ultra-Short Pulse optical seed and indeed can be a wavelength and temporally selectable pulse optical seed.

In one version of the present invention the master oscillator is an Ultra-Short Pulse long-wave infrared master oscillator configured to produce selectable supercontinuum Ultra-Short Pulse optical seeds. The amplifier supports Raman amplification and indeed stimulated Raman amplification.

The optical sources (pumps) are, in one version of the present invention, two or more continuous wave low brightness quantum cascade lasers. In another version of the present invention the pumps are two or more continuous wave fiber coupled low brightness quantum cascade lasers. And in yet another embodiment the optical pump sources include two or more quasi-continuous wave fiber coupled low brightness quantum cascade lasers. The optical sources (pumps) are based on the optical seeds and co- and/or counter-propagating.

In another embodiment of the present invention a method begins with producing, by a master oscillator, two or more optical seeds. The two or more optical seeds are received by an amplifier wherein the process continues by combining, into a volume each of the two or more optical seeds with a distinct one of two or more independent optical pump sources. The combination producing two or more distinct amplified coherent wavelength selectable optical pump sources.

The features and advantages described in this disclosure and in the following detailed description are not all-inclusive. Many additional features and advantages will be apparent to one of ordinary skill in the relevant art in view of the drawings, specification, and claims hereof. Moreover, it should be noted that the language used in the specification has been principally selected for readability and instructional purposes and may not have been selected to delineate or circumscribe the inventive subject matter; reference to the claims is necessary to determine such inventive subject matter.

BRIEF DESCRIPTION OF THE DRAWINGS

The aforementioned and other features and objects of the present invention and the manner of attaining them will become more apparent, and the invention itself will be best understood, by reference to the following description of one or more embodiments taken in conjunction with the accompanying drawings, wherein.

The Figures depict embodiments of the present invention for purposes of illustration only. Like numbers refer to like elements throughout. In the figures, the sizes of certain lines, layers, components, elements, or features may be exaggerated for clarity. One skilled in the art will readily recognize from the following discussion that alternative embodiments of the structures and methods illustrated herein may be employed without departing from the principles of the invention described herein.

DESCRIPTION OF THE INVENTION

Two or more amplified, distinct, and selectable coherent wavelength optical pump sources are produced from combining optical seeds, generated from one or more master oscillators, with independent optical pump sources within material that supports Raman amplification. Using an amplifier medium that supports Raman amplification two or more tunable optical seeds can be simultaneously combined with respective optical sources, also referred to herein as pumps, separated in wavelength from the optical seed by a Stokes shift. The actual difference in wavelength is based on the material used for amplification. Upon being combined within the amplification media a power transfer occurs from each optical source (pump) to each optical seed.

Figure 1:
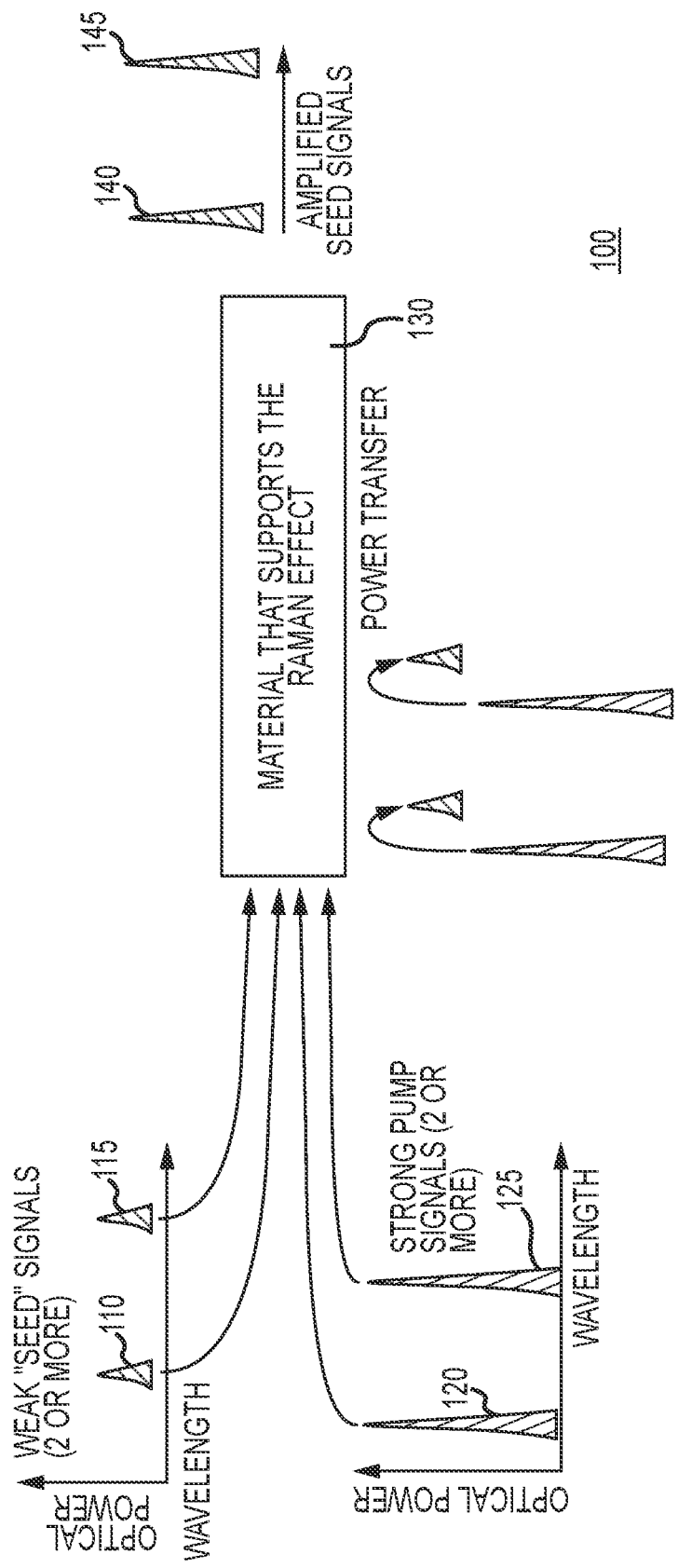
FIG. 1 presents a high-level system diagram of a system for producing a selectable coherent wavelength optical source.

FIG. 1 presents a high-level system diagram of a system 100 for producing two or more selectable coherent wavelength optical pump sources. Two or more source seed signals 110, 115 are each and distinctly combined with separate pump signals 120, 125 in a material 130 that supports Raman effect amplification. The wavelength of the pump signals differs from the seed signal by 1 Stokes shift. The Stokes shift is based on the material choose for Raman amplification. The result, according to one or more embodiments of the present invention, is two or more amplified selectable coherent wavelength optical seed sources 140, 145.

Figure 2:
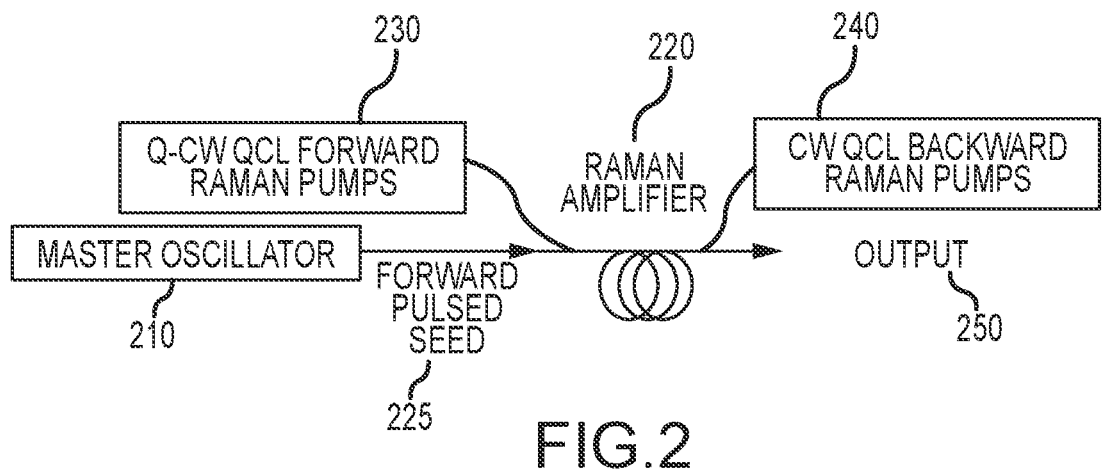
FIG. 2 shows an optical architecture of the present invention using a Master Oscillator (MO) and a Raman Amplifier.

The optical architecture of the present invention shown in FIG. 2 utilizes in one embodiment, a Master Oscillator (MO) 210 and a Power Raman Amplifier 220. In one version of the present invention the master oscillator 210 is an Ultra Short Pulse (USP) Long Wavelength InfraRed (LWIR) source. The USP LWIR MO forward seeds 225 a Raman amplifier section 220 comprising, in one embodiment, a Double-Clad Chalcogenide (DCC) with two or more optical seeds. The amplifier 220 is thereafter pumped by a high-power laser 230, 240 for each respective seed. For example, in one version of the present invention the two or more ultrashort low wavelength infrared seeds are each combined within a Raman amplifier 220 with a respective high-power Fiber Coupled (double clad fiber) low brightness Quantum Cascade Lasers (FC-QCL) 230, 240. The process of the present invention converts low brightness quasi continuous wave and continuous wave pumps into two or more distinct high brightness and high peak power low wavelength infrared pulses 250. Note that, as shown, the pumping action can be forward 230 and/or backward 240.

Embodiments of the present invention are hereafter described in detail with reference to the accompanying Figures. Although the invention has been described and illustrated with a certain degree of particularity, it is understood that the present disclosure has been made only by way of example and that numerous changes in the combination and arrangement of parts can be resorted to by those skilled in the art without departing from the spirit and scope of the invention.

The following description with reference to the accompanying drawings is provided to assist in a comprehensive understanding of exemplary embodiments of the present invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

The terms and words used in the following description and claims are not limited to the bibliographical meanings but are merely used by the inventor to enable a clear and consistent understanding of the invention. Accordingly, it should be apparent to those skilled in the art that the following description of exemplary embodiments of the present invention are provided for illustration purpose only and not for the purpose of limiting the invention as defined by the appended claims and their equivalents.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

By the term "Raman effect" is meant change in the wavelength of light that occurs when a light beam is modified by interacting with vibrations or rotations of a molecule in a material medium. When a beam of light traverses a dust-free, transparent sample of a chemical compound, a fraction of the light emerges in the same or in directions other than that of the incident (incoming) beam. A portion of this scattered light is of unchanged wavelength. Another portion, however, has wavelengths different from that of the incident light; its presence is a result of the Raman effect. Raman scattering is perhaps most easily understandable if the incident light is considered as consisting of particles, or photons (with energy proportional to frequency), that strike the molecules of the sample. Some of the encounters are elastic, and the photons are scattered with unchanged energy and frequency. On some occasions, however, the molecule takes up energy from or gives up energy to the photons, which are thereby scattered with diminished or increased energy, hence with lower or higher frequency. The frequency shifts are thus measures of the amounts of energy involved in the transition between initial and final states of the scattering material.

By the term "Raman amplifier" is meant an optical amplifier based on Raman gain, which results from the effect of stimulated Raman scattering. The Raman-active medium is often an optical fiber, although it can also be a bulk crystal, a waveguide in a photonic integrated circuit, or a cell with a gas or liquid medium. An input signal can be amplified while co- or counterpropagating with a pump beam, the wavelength of which is typically a few tens of nanometers shorter. For silica fibers, maximum gain is obtained for a frequency offset of ≈10-15 THz between pump and signal, depending on the composition of the fiber core.

By the term "cascading" is meant something arranged or occurring in a series or in a succession of stages so that each stage derives from or acts upon the product of the preceding.

By the term "laser" is meant a device that emits light through a process of optical amplification based on the stimulated emission of electromagnetic radiation. Lasers can also have high temporal coherence, which allows them to emit light with a very narrow spectrum.

By the term "Stokes Shift" is meant the difference (in wavelength or frequency. units) between the incident and scattered light due to the interactions with the material medium. Sometimes Stokes shifts are given in wavelength units, but this is less meaningful than energy, wavenumber or frequency units because it depends on the absorption wavelength. When a system (be it a molecule or atom) interacts with a photon, it can be via a virtual state. One result of the interaction is to emit a wavelength shifted photon, thus changing its energy. When the emitted photon has less energy than the absorbed photon, this energy difference is the Stokes shift and vice-verse, an Anti-Stokes shift.

By the term "supercontinuum" is meant a collection of nonlinear processes acting together upon an optical beam in order to cause spectral broadening of the original optical beam. The result is an extended and generally continuous spectrum and therefore referred to as a supercontinuum. In one sense supercontinuum generation is a process where laser light is converted to light with a very broad spectral bandwidth or broad continuous spectra through propagation of high intensity pulses through nonlinear media.

The terminology used herein is for the purpose of describing embodiments only and is not intended to be limiting of the invention. As used herein, the singular forms "a," "an" and "the" are intended to include the plural forms as well, unless the context clearly indicates otherwise. Thus, for example, reference to "a component surface" includes reference to one or more of such surfaces.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present), and B is false (or not present), A is false (or not present), and B is true (or present), and both A and B are true (or present).

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

It will be also understood that when an element is referred to as being "on," "attached" to, "connected" to, "coupled" with, "contacting", "mounted" etc., another element, it can be directly on, attached to, connected to, coupled with, or contacting the other element or intervening elements may also be present. In contrast, when an element is referred to as being, for example, "directly on," "directly attached" to, "directly connected" to, "directly coupled" with or "directly contacting" another element, there are no intervening elements present. It will also be appreciated by those of skill in the art that references to a structure or feature that is disposed "adjacent" another feature may have portions that overlap or underlie the adjacent feature.

Spatially relative terms, such as "under," "below," "lower," "over," "upper" and the like, may be used herein for ease of description to describe one element or feature's relationship to another element(s) or feature(s) as illustrated in the figures. It will be understood that the spatially relative terms are intended to encompass different orientations of a device in use or operation in addition to the orientation depicted in the figures. For example, if a device in the figures is inverted, elements described as "under", or "beneath" other elements or features would then be oriented "over" the other elements or features. Thus, the exemplary term "under" can encompass both an orientation of "over" and "under". The device may be otherwise oriented (rotated 90 degrees or at other orientations) and the spatially relative descriptors used herein interpreted accordingly. Similarly, the terms "upwardly," "downwardly," "vertical," "horizontal" and the like are used herein for the purpose of explanation only unless specifically indicated otherwise.

FIG. 2 shows, according to one embodiment or the present invention, an architecture using a low wavelength infrared SuperContinuum (SC) signal 225 from a master oscillator 210 to seed an amplifier 220 that supports the Raman effect. Counter-propagating, high-power, continuous wave, and quasi-continuous wave quantum cascade lasers 230, 240 pump (amplify) the optical seeds. The architecture of the present invention allows for a broad spectral and temporal tuning range by choice of seed filtering and quantum cascade laser pump wavelengths.

Figure 3:
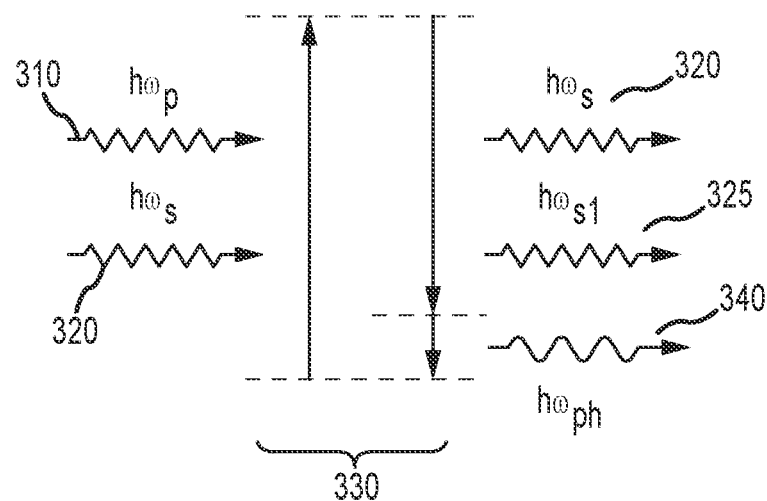
FIG. 3 illustrates the Raman wavelength conversion process applied to one or more embodiments of the present invention

FIG. 3 illustrates the Raman wavelength conversion process applied to one or more embodiments of the present invention. As shown a pump photon 310 at frequency $\omega_p$, and seed (or signal) photon 320 at frequency $\omega_s$, is combined in a material 330 that supports Raman amplification. During Raman Amplification the pump photon, $\omega_p$ 310, excites the gain medium to a virtual energy level, while the signal photon, $\omega_s$ 370, stimulates the emission of a second signal photon $\omega_{s1}$ 325 and a phonon at frequency $\omega_{ph}$ 340. Thus, there is stimulated gain, and the two signal photons 320, 325 are automatically mutually coherent for this type of nonlinear optical process.

In one version of the present invention, a Raman amplifier is seeded by a pulsed master oscillator that produces two or more signal pulses (seeds) to be amplified at a wavelength which is at the $1^{st}$ Stokes shift from the pump wavelengths. The Raman pumps can be either forward or backward propagating and comprised of multiple independent sources, one for each respective seed. The pump power is transferred to the seed signal via the stimulated Raman amplification process within the Raman gain medium. It is important to note how this configuration differs from the conventional optical amplifier with a doped gain media. The Raman conversion is a nearly instantaneous nonlinear process and only requires that difference in pump and signal photon energies lie within the Raman gain media bandwidth. This enables greater flexibility in the choice of signal and pump wavelengths and pulse widths. The Raman gain media can consist of solids, gases, or liquids, and this basic process can produce ultra-short pulse output from ultraviolet to far infrared.

Figure 4:
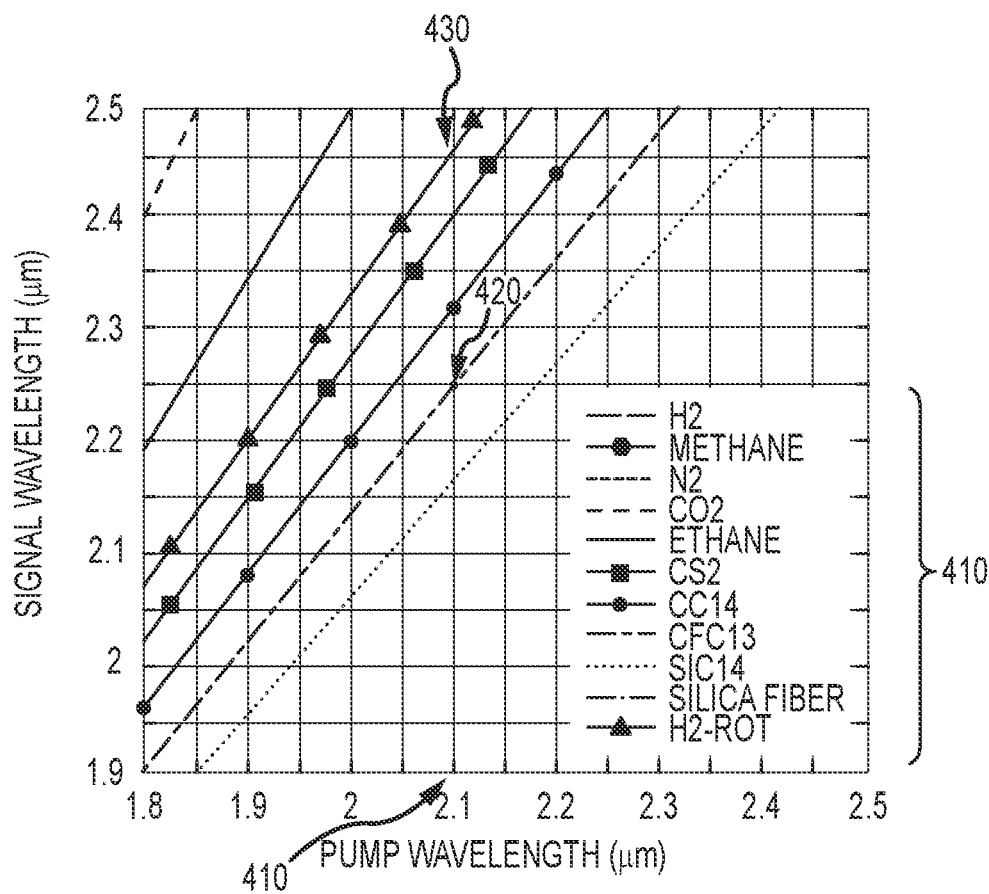
FIG. 4 shows the relationship for several different Raman gain media as would be known to one of reasonable skill in the relevant art.

As mentioned above, the signal seed and pump wavelengths of the present invention should differ by the Stokes shift based on the Raman gain media. FIG. 4 shows the relationship for several different Raman gain media 410 as would be known to one of reasonable skill in the relevant art. The vertical line from ~2.1 μm fundamental wavelength axes intercept 410 the silica fiber and $H_2$ (Rotational Raman) curves at ~2.25 μm 420 and ~2.45 μm 430, respectively. Therefore, in one embodiment, the present invention can be configured with a 2.1 μm pump and either of these Raman gain media cases by tuning the optical filter within the master oscillator to achieve the correct signal wavelength, which is 2.25 μm and 2.45 μm, respectively. In one example of the present invention, double clad optical fiber is used when the Raman gain medium is a fused silica core, and gas-filled hollow-core optical fiber can be used when the Raman amplification is in a molecular gas.

Figure 5:
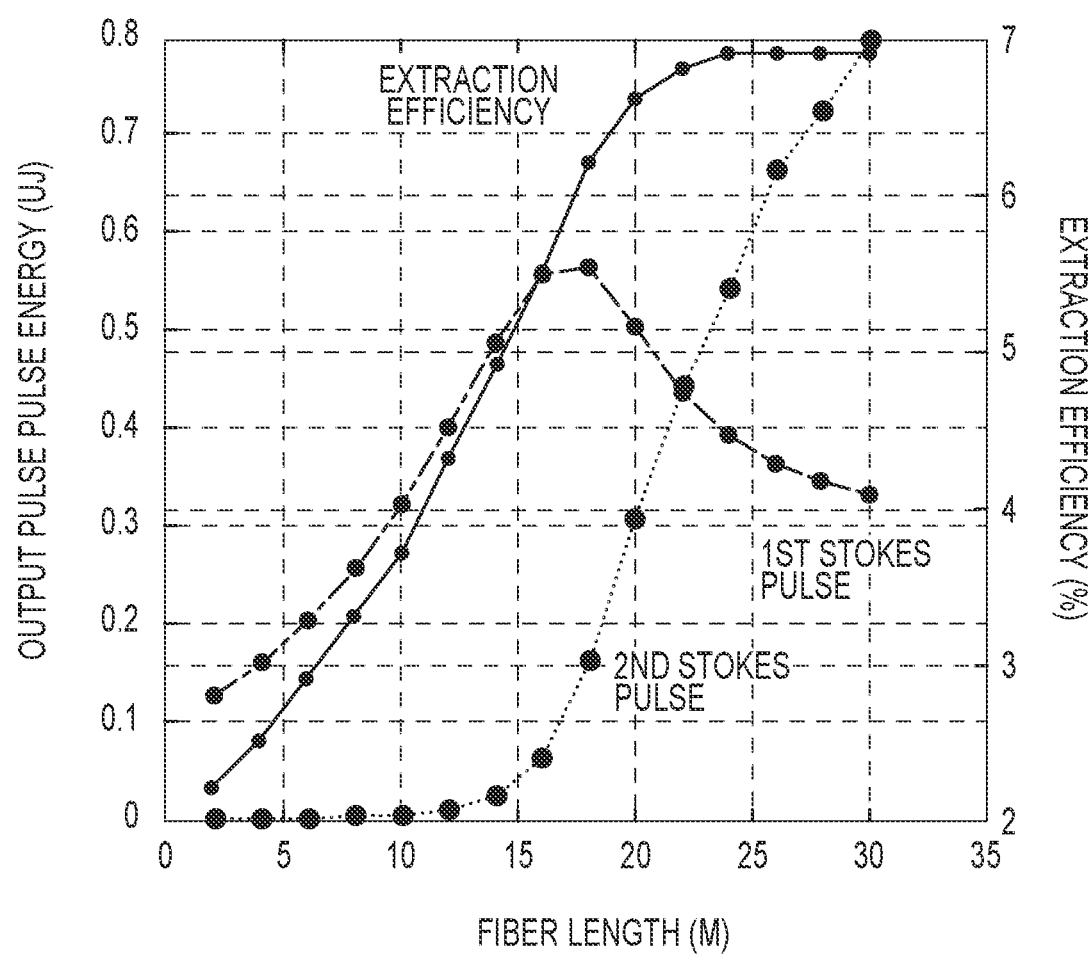
FIG. 5 below shows a numerical modeling result demonstrating the power transfer, according to one embodiment of the present invention, from forward quasi continuous wave and backward continuous wave pumps to a forward propagating 1st and 2nd Stokes ultra-short pulse.

FIG. 5 below shows a numerical modeling result demonstrating the power transfer, according to one embodiment of the present invention, from forward quasi continuous wave and backward continuous wave pumps to a forward propagating 1st and 2nd Stokes ultra-short pulse. The backward continuous wave pump is, in this example, 100 W at 7.1 μm. The 1 ns duration forward quasi continuous wave pump is at 8.45 μm. The input seed is 1 nJ at 10.435 μm. The modeling indicates that for best conversion efficiency, the pumps and signal should be both co- and counter-propagating. The co-propagating pump is chopped to ~1 ns to improve efficiency. Since Raman amplification is an instantaneous process, the pump is only required during the signal transit through the photonic crystal fiber section and can be modulated to increase power efficiency and reduce thermal loads. Finally, for the example shown, the signal peak power increases from 1 kW CW to 0.5 MW for a 1 ps pulse duration case while the beam quality is expected to be single fundamental mode. The repetition rate can be in the many 10s of MHz and therefore an average power can approach many 10s of Watts.

Figure 6:
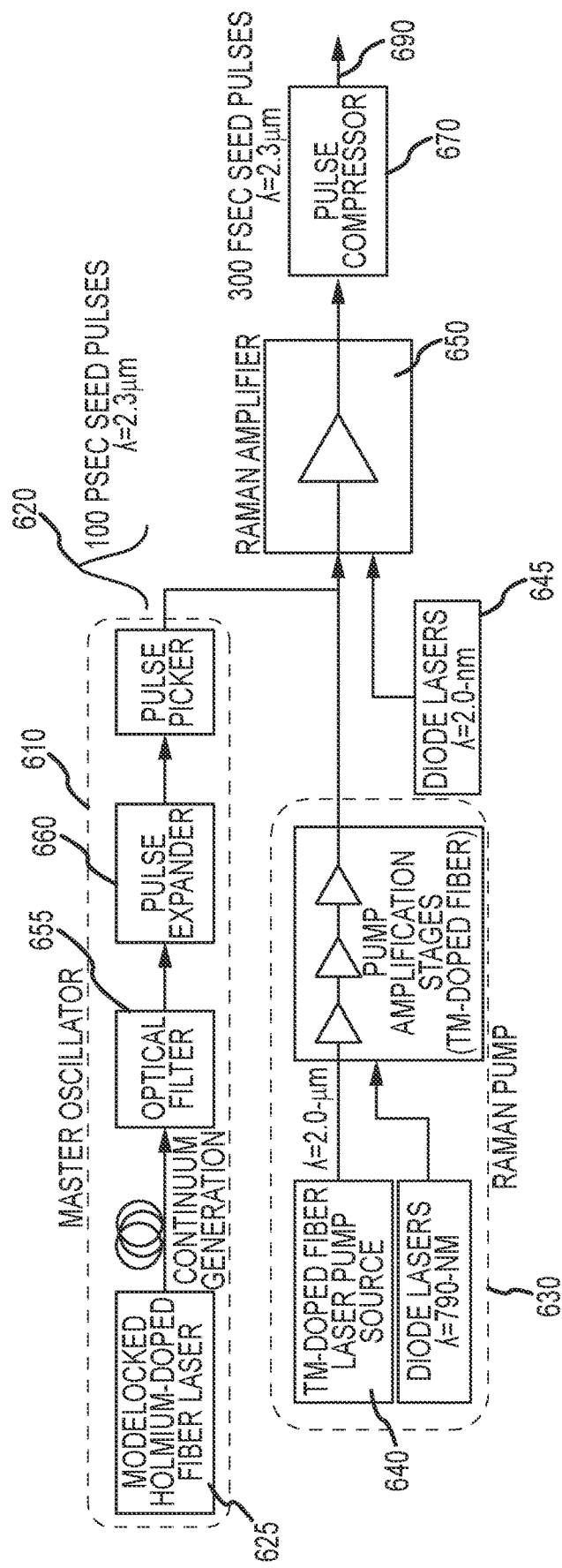
FIG. 6 presents a block diagram of an architecture for the case of $SiO_2$ optical fiber as the Raman gain media.

FIG. 6 presents a block diagram of an architecture for the case of $SiO_2$ optical fiber as the Raman gain media. The system architecture and process are the same as described in FIG. 3 and consists of a master oscillator 610 generating an ultra-short pulse signal 620. In this case the ultra-short pulse seed is generated from a mode-locked Holmium-doped fiber laser 625. An optical source or pump 630 is in this instance generated from a Thulium (Tm) ns pulsed fiber laser 640. The signal 620 and pump 630 are combined and injected into the Raman amplifier which, in this example case, is a Tm-doped double-clad optical fiber. The signal beam is coupled into the fiber core while the pump is coupled to the outer cladding.

Tm doping allows for a dynamic replenishment of the pump (with power from the diode lasers 645) as power is transferred to the signal beam (seed). The use of this hybrid (combined) amplification configuration results in high-energy signal pulses 690 being created with less fiber and fewer components. In this example only the forward pumped condition is shown for simplicity. Seed ultra-short pulses at the output wavelength of ~2.3 μm 620 is created by selectively filtering a supercontinuum tunable pulse generated by propagating the ultra-short pulses from the master oscillator 610 though a length of nonlinear optical fiber. The two or more filtered 655 seed pulses are temporally spread by an expander 660 to minimize detrimental nonlinear optical effects during the amplification process and re-compressed 670 at the system output—a process known as Chirped Pulse Amplification (CPA). A pulse picker is used to control the pulse repetition rate. The configuration as described uses conventional $SiO_2$ based optical fibers. However, the Raman amplifier can, in other embodiments, be implemented with gas-filled hollow-core fiber.

The architecture of the present invention enables the 8-12 μm wavelength region can be accessed electronically by selecting the seed signal, through laser filtering and controlling Raman pump wavelengths. The invention supports large infrared Raman gains and bandwidths along with a broad range of pulse durations spanning from ns to sub-ps with high conversion efficiency. In one embodiment double-clad Raman fiber amplifier combines low brightness seeds and high-power infrared continuous wave quantum cascade lasers to high brightness and peak power ultra-short pulses using non-phased matched Raman conversion processes. In all cases the average power, peak power, pulse duration and repetition rate can be independently controlled.

Two or more seed optical pulses amplified, in one embodiment, by a continuous (relatively low brightness) wave pump over a broad range of wavelengths and pulse durations, can be converted into a high brightness signal over a broad range of wavelengths and pulse durations. In one embodiment two or more continuous wave seeds can be amplified by separate and distinct pulsed pumps thereby taking on the pump's temporal characteristics and attaining a high peak power pulse at two or more select wavelengths. In another embodiment spectral filtering within the gain media is used to suppress the higher order Stokes shifts, thereby accumulating power at specific wavelengths.

The processes of the present invention use Raman non-linear optical inelastic scattering as a basic underlying optical amplification process. Using fiber optic, and other optical waveguide types, spatial confinement of the various optical radiations is provided thereby enabling an efficient power transfer from the pump to signal beam.

Unlike a doped laser seed, embodiments of the present invention do not require a laser gain species. Rather the operating wavelength is only material and pump availability dependent. Moreover, the Raman processes can up-shift (Anti-Stokes) or down-shift (Stokes) photon energies allowing for large bandwidth, multiple independent simultaneous signal fields. The present invention provides for high average power scaling that does not require phase matching and for which the pump and signal need not be mutually coherent. By doing so the present invention can utilize a large range of material phases—amorphous through single crystal, gases, and liquids.

Some embodiments of the present invention combine seeded and un-seeded amplification to gain optical brightness and temporal conversion. To have efficient energy transfer from the pump to the desired first Stokes mode, two significant limiting effects that occur using traditional stimulated Raman amplification co- and counter-propagating pumps and signals must be overcome. The effects are 1) the generation of higher order Stokes (and anti-Stokes) modes during stimulated Raman amplification which parasitically draw power from the desired Stokes signal, and 2) non-optimal temporal/spatial overlap between the long duration pump and short duration signal fields. To mitigate the effect, Tilted Fiber Bragg Gratings (TFBG) and Chirped-TFBG (C-TFBG), and Long Period Fiber Gratings are employed.

Figure 7:
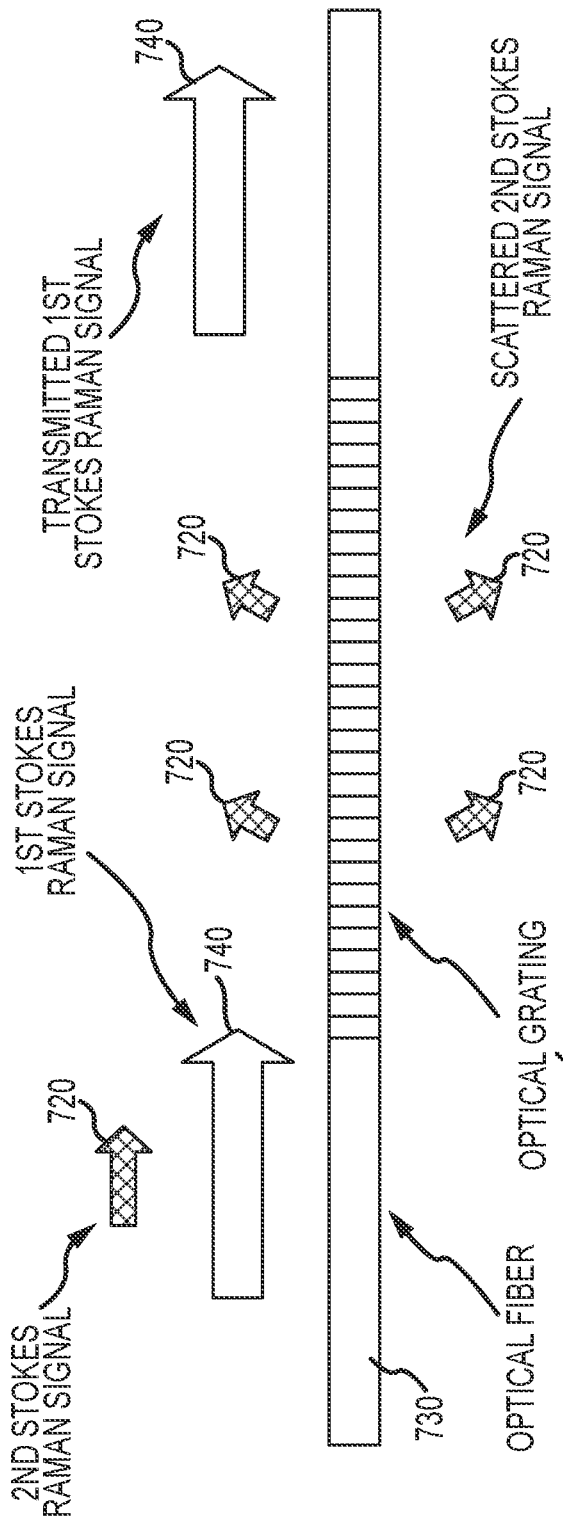
FIG. 7 presents gratings used to allow for power and energy accumulation at the desired terminal wavelength, according to one embodiment of the present invention.

In one embodiment, higher order Stokes and wavelength generation suppression and bandwidth are controlled via filtering. For example, in one embodiment 45-degree Bragg and Long period Bragg gratings are used to allows for power and energy accumulation at the desired terminal wavelength. In example shown in FIG. 7, the dimensions of the grating 710 are chosen so that light with a wavelength equal to the wavelength of the $2^{nd}$ Stokes Raman signal 720 is scattered from an optical fiber 730, while the $1^{st}$ Stokes signal 740 is transmitted through the fiber. This implementation suppresses buildup of a $2^{nd}$ Stokes signal and concentrates optical power in the $1^{st}$ Stokes signal.

Figure 8:
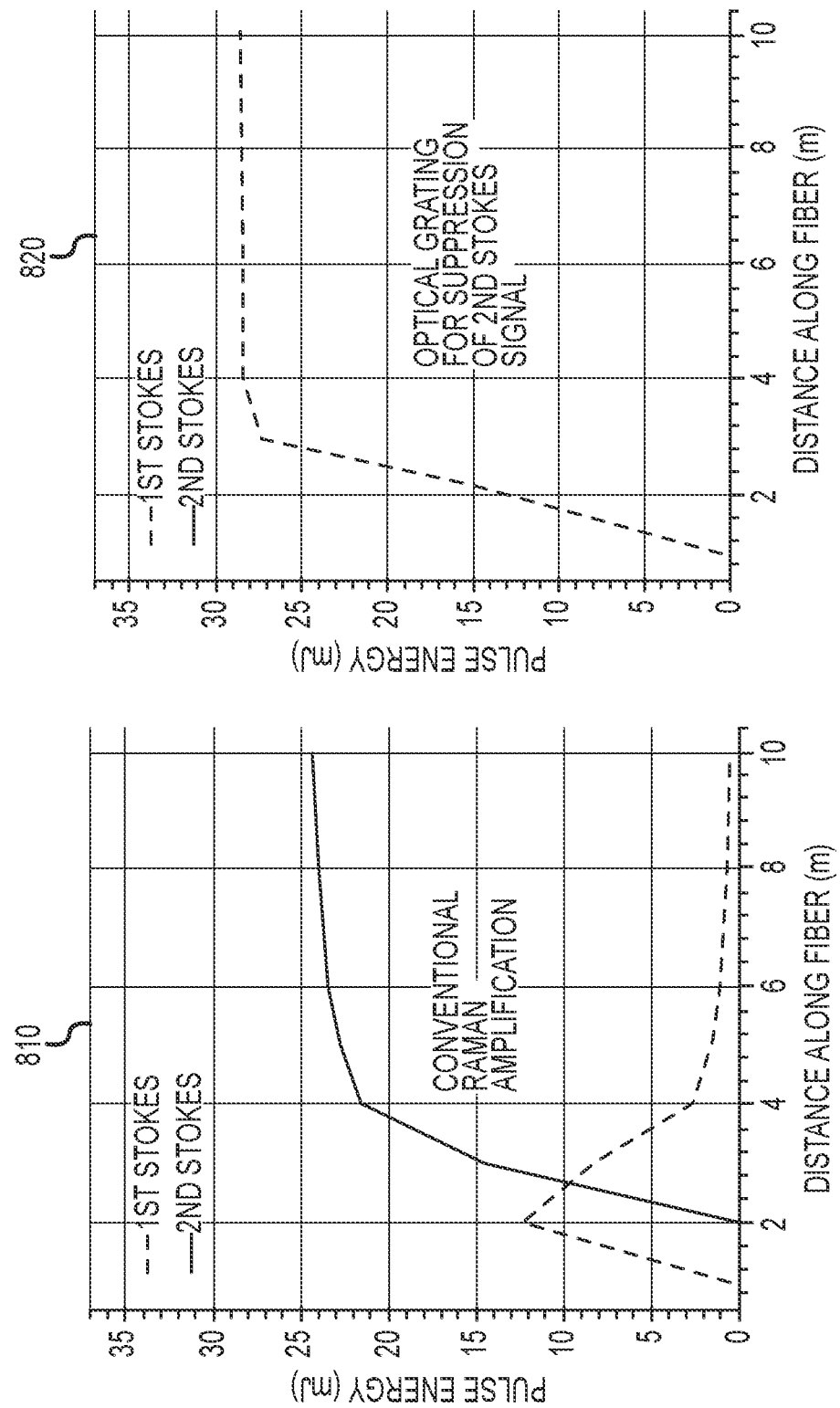
FIG. 8 shows a data plot of results of transfer of optical power along an optical fiber from incoherent pump light to a coherent $1^{st}$ Raman Stokes signal, according to one embodiment of the present invention.

FIG. 8 shows a data plot of results of transfer of optical power along an optical fiber from incoherent pump light to a coherent $1^{st}$ Raman Stokes signal, according to one embodiment of the present invention. The plot on the left 810 of FIG. 8 illustrates how generation of a $2^{nd}$ Stokes signal limits the power that can be transferred into the $1^{st}$ Stokes signal. The plot on the right 820 illustrates the use of an optical grating to suppress generation of a $2^{nd}$ Stokes signal and to achieve higher power transfer to the $1^{st}$ Stokes signal.

Figure 9:
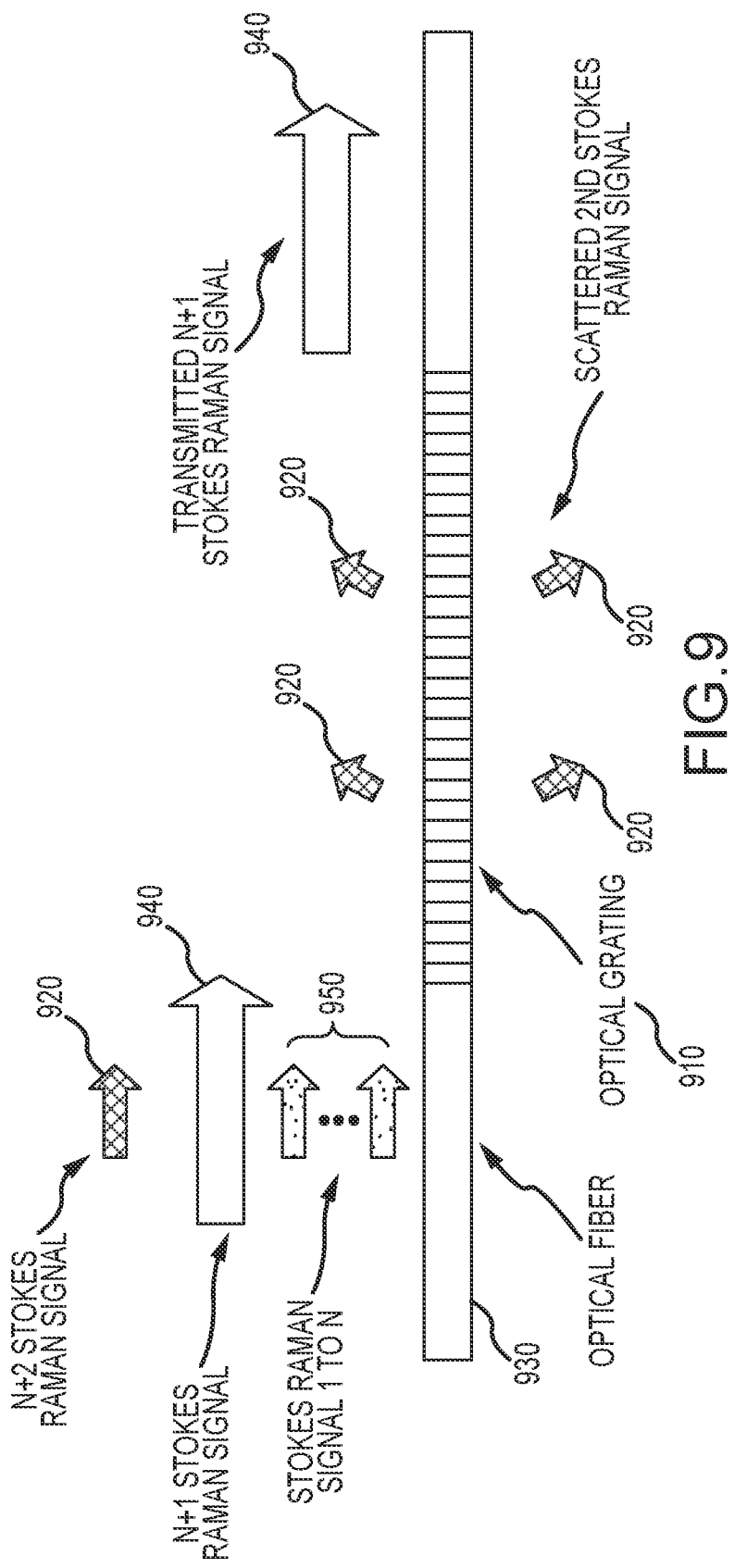
FIG. 9 presents a grating that is used as an optical filtering element, according to one embodiment of the present invention.

In another embodiment, shown in FIG. 9, a grating 910 is used as an optical filtering element. The dimensions of this grating are chosen so that light with a wavelength equal to the N+2 Stokes signal 920 is scattered from the optical fiber 930, while all lower-order Stokes signals 940 are transmitted. This implementation in this example causes optical power to cascade through the Raman process from the 1st Stokes Raman signal 950 to the 2nd and so on, until the optical power is accumulated in the N+1 Raman signal 940, when the processes is terminated.

Figure 10:
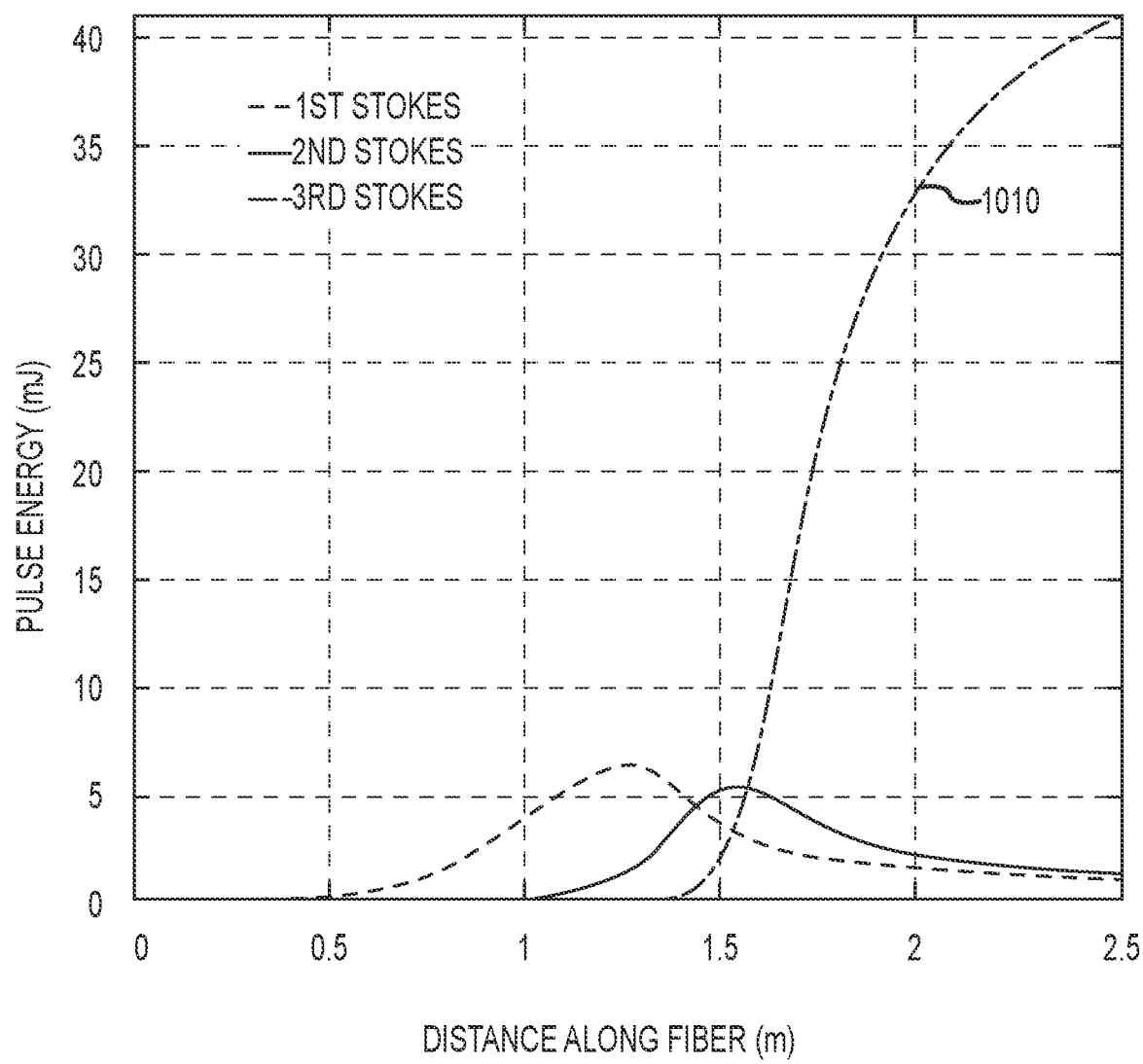
FIG. 10 presents a graphical representation of the transfer of optical power along an optical fiber from incoherent pump light to coherent Raman Stokes signals using an optical filter.

FIG. 10 presents a graphical representation of the transfer of optical power along an optical fiber from incoherent pump light to coherent Raman Stokes signals using an optical filter. FIG. 10 also illustrates how optical power accumulates in the in the $3^{rd}$ Stokes signal 1010 when the Raman cascade process is terminated by suppressing the $4^{th}$ order Stokes signal with an optical grating. For these data, the suppression is high and virtually all pump power is transferred to the $3^{rd}$ Stokes signal.

The ultra-short pulse seed and optical pumps can be either continuous wave or pulsed sources as required within a double clad fiber configuration, including infrared glass double clad fibers. An infrared version of the present invention uses quantum cascade laser pumps with added spectral filtering and energy accumulation to extend to hollow core fibers and capillaries with Raman gases.

In other embodiments of the present invention, spectrally diverse amplifiers with parallel amplifiers can be used for power and energy scaling. This scaling may implement a linear or regenerative amplifier configuration. And while in one configuration solid optical fibers are used, they can be replaced by hollow core fibers or capillary tubes filled with gas for guiding the optical radiation. Similarly, traditional resonant optical cavity can be formed using mirrors with a Raman gain material within the cavity which can be advantageous for high energy and power operations. Additionally, rotational Raman gain in gases can be used to achieve smaller Stokes energy shifts when needed.

Figure 11:
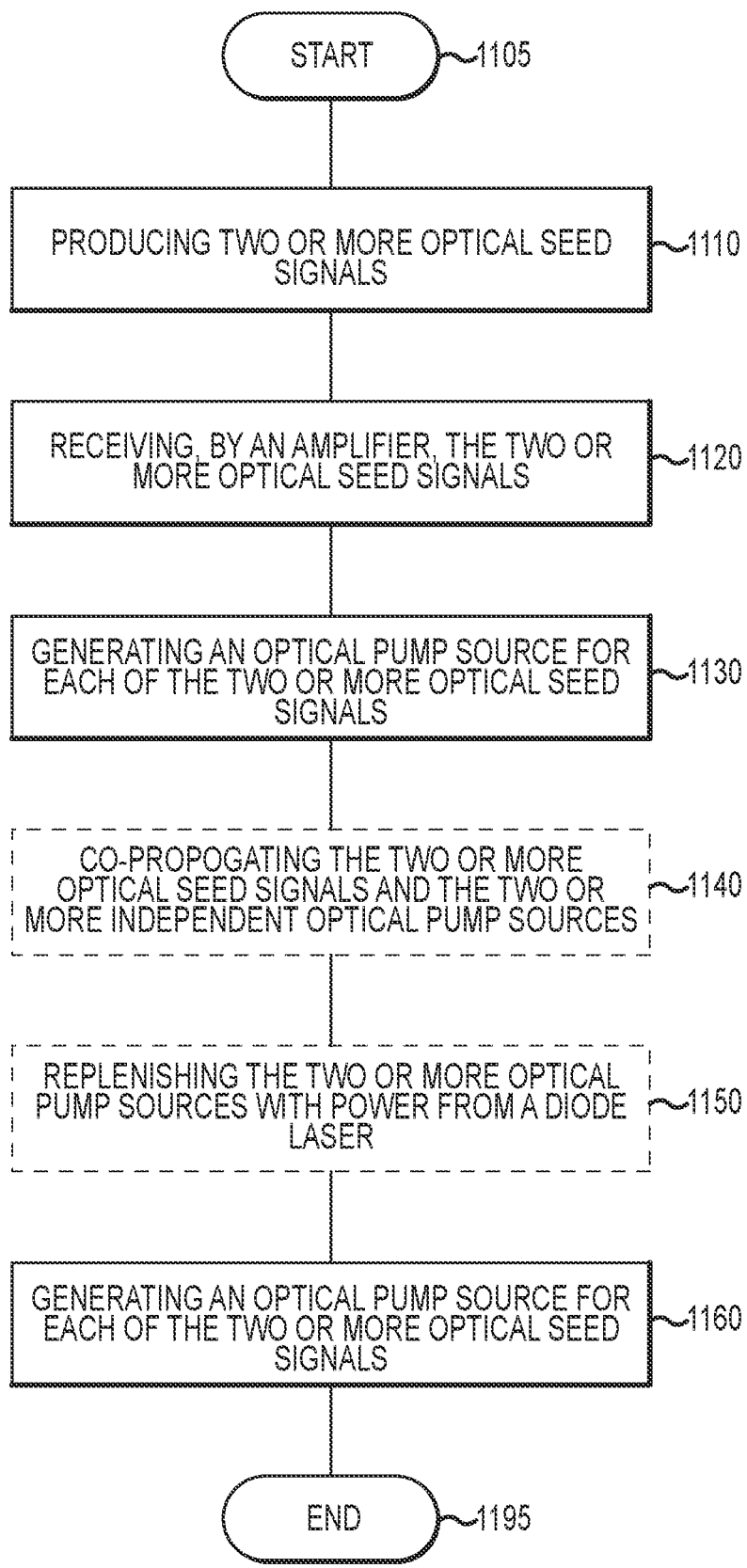
FIG. 11 presents a flowchart of the methodology used to form two or more tunable amplified coherent wavelength optical pump sources.

The flowcharts shown in FIG. 11 depict examples of the methodology which may be used to form two or more tunable amplified coherent wavelength optical pump sources. In the following description, it will be understood that each block of the flowchart illustrations, and combinations of blocks in the flowchart illustrations, can be implemented by a combination of computer program instructions, firmware, and hardware. When these steps are in the form of computer instructions, one of reasonable skill in the relevant art will recognize that the instructions may be loaded onto a computer or other programmable apparatus to produce a machine such that the instructions that execute on the computer or other programmable apparatus create means for implementing the functions specified in the flowchart block or blocks. These computer program instructions may also be stored in a computer-readable memory that can direct a computer or other programmable apparatus to function in a particular manner such that the instructions stored in the computer-readable memory produce an article of manufacture including instruction means that implement the function specified in the flowchart block or blocks. The computer program instructions may also be loaded onto a computer or other programmable apparatus to cause a series of operational steps to be performed in the computer or on the other programmable apparatus to produce a computer implemented process such that the instructions that execute on the computer or other programmable apparatus provide steps for implementing the functions specified in the flowchart block or blocks.

Accordingly, blocks of the flowchart illustrations support combinations of means for performing the specified functions and combinations of steps for performing the specified functions. It will also be understood that each block of the flowchart illustrations, and combinations of blocks in the flowchart illustrations, can be implemented by special purpose hardware systems that perform the specified functions or steps, or combinations of special purpose hardware, computer instructions and/or firmware.

The process for producing two or more amplified selectable coherent wavelength optical pump sources begins 1105 with producing 1110, by two or more optical seeds. A master oscillator forms two or more low energy light sources as a basis for corresponding high-power signals. These signals are received 1120 by an amplifying medium that in one embodiment, supports Raman amplification. Within the volume of the amplifier the two or more seeds are each combined 1160 with a corresponding independent optical source generated from an optical pump 1130. Each optical source is 1 Stokes shift away from its corresponding seed. The actual dimension of the Stokes shift is based on the amplification material. Accordingly, the Raman effect within the amplifier transfers 1140 energy from the optical source to the seed resulting 1195 in the desired higher power, lower wavelength signal. (Note: the optical pump sources can be replenished 1150 with power from a diode laser.)

The present invention enables the generation of wavelength agile optical radiation across a large spectral range. Indeed, one or more embodiments of the present invention enable generation of multiple, simultaneous wavelength agile optical signals. In both instances the temporal pulse duration and the bandwidth are selectable with the operating wavelength being merely material and pump availability dependent. The Raman effect process can up-shift or down-shift photon energies realizing high average power scaling.

The present invention presents an ultra-short pulse and amplifies it using Raman effect amplification obtaining Terawatt (TW) class peak powers. An optically seeded Stimulated Raman Amplification process converts moderate average power and low brightness pump light into high peak power and high brightness ultra-short pulses. In Raman wavelength conversion process the pump photon excites the gain medium to a virtual energy level, while the signal photon (seed) stimulates the emission of a second signal photon and a phonon. Thus, there is stimulated gain and the two signal photons are automatically mutually coherent.

The pump power is transferred to the signal via the stimulated Raman amplification process within the Raman gain medium. Unlike the prior art, the Raman conversion is an instantaneous nonlinear process and only requires that difference in pump and signal photon energies lie within the Raman gain media bandwidth. This enables greater flexibility in the choice of signal and pump wavelengths and pulse widths. The Raman gain media can consist of solids, gases, or liquids, and this basic process can produce ultra-short pulse output from UV to Far-IR.

While there have been described above the principles of the present invention in conjunction with a tunable coherent wavelength optical source system, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features that are already known per se, and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The Applicant hereby reserves the right to formulate new claims to such features and/or combinations of such features during the prosecution of the present application or of any further application derived therefrom.

We claim:

1. A coherent wavelength optical source system, comprising:
    a tunable master oscillator configured to produce two or more optical seeds;
    an amplifier configured to receive the two or more optical seeds; and
    two or more independent optical pump sources, wherein each of the two or more optical seeds are combined into a volume within the amplifier with a distinct one of the two or more independent optical pump sources thereby producing two or more amplified tunable coherent wavelength optical pump sources.

2. The coherent wavelength optical source system of claim 1, wherein each of the two or more optical pump sources occupies a separate and overlapping volume within the amplifier.

3. The coherent wavelength optical source system of claim 1, wherein each optical seed is a coherent Ultra-Short Pulse optical seed.

4. The coherent wavelength optical source system of claim 1, wherein each optical seed is a tunable pulse optical seed.

5. The coherent wavelength optical source system of claim 3, wherein the tunable pulse optical seed is a tunable supercontinuum Ultra-Short Pulse optical seed.

6. The coherent wavelength optical source system of claim 1, wherein the master oscillator is an Ultra-Short Pulse long-wave infrared master oscillator.

7. The coherent wavelength optical source system of claim 1, wherein the amplifier supports laser and Raman amplification.

8. The coherent wavelength optical source system of claim 1, wherein the two or more optical pump sources include two or more continuous wave low brightness lasers.

9. The coherent wavelength optical source system of claim 1, wherein the two or more optical pump sources include two or more continuous wave fiber coupled low brightness lasers.

10. The coherent wavelength optical source system of claim 1, wherein the two or more optical pump sources include two or more quasi-continuous wave fiber coupled low brightness lasers.

11. The coherent wavelength optical source system of claim 1, wherein the two or more optical pump sources are based on the two or more optical seeds.

12. The coherent wavelength optical source system of claim 1, wherein the two or more optical pump sources are co- and/or counter-propagating.

13. A method for producing two or more amplified coherent wavelength optical pump sources, the method comprising:
   producing, by a tunable master oscillator, two or more optical seeds;
   receiving, by an amplifier, the two or more optical seeds; and
   combining, into a volume and within the amplifier, each of the two or more optical seeds with a distinct one of two or more independent optical pump sources thereby producing two or more amplified tunable coherent wavelength optical pump sources.

14. The method for producing two or more distinct coherent wavelength optical pump sources according to claim 13, further comprising co-propagating the two or more optical seeds and the two or more independent optical pump sources.

15. The method for producing two or more distinct coherent wavelength optical pump sources according to claim 13, further comprising replenishing the two or more optical pump sources with power from a diode laser.

16. The method for producing two or more distinct coherent wavelength optical pump sources according to claim 13, further comprising forming the two or more optical seeds by propagating an Ultra-Short Pulse from the tunable master oscillator through a length of nonlinear optical fiber.

17. The method for producing two or more distinct coherent wavelength optical pump sources according to claim 13 wherein the two or more independent optical pump sources are continuous wave infrared quantum cascade lasers.

* * * * *